United States Patent
Zhao et al.

(10) Patent No.: US 9,780,010 B1
(45) Date of Patent: Oct. 3, 2017

(54) HERMETIC PACKAGE WITH IMPROVED RF STABILITY AND PERFORMANCE

(71) Applicant: Qorvo US, Inc., Greensboro, NC (US)

(72) Inventors: Bo Zhao, Allen, TX (US); Raj Santhakumar, Richardson, TX (US); Randy Kinnison, Sherman, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/378,575

(22) Filed: Dec. 14, 2016

Related U.S. Application Data

(60) Provisional application No. 62/312,898, filed on Mar. 24, 2016.

(51) Int. Cl.
| | | |
|---|---|---|
| *H01L 23/12* | (2006.01) | |
| *H01L 23/10* | (2006.01) | |
| *H01L 23/047* | (2006.01) | |
| *H01L 23/31* | (2006.01) | |
| *H01L 23/66* | (2006.01) | |
| *H01L 23/538* | (2006.01) | |

(52) U.S. Cl.
CPC ...... *H01L 23/3142* (2013.01); *H01L 23/3121* (2013.01); *H01L 23/5386* (2013.01); *H01L 23/66* (2013.01)

(58) Field of Classification Search
CPC ..... H01L 23/3114; H01L 23/15; H01L 23/10; H01L 23/3121; H01L 23/5386; H01L 23/49838; H01L 23/04; H01L 23/053; H01L 23/02

See application file for complete search history.

(56) References Cited

U.S. PATENT DOCUMENTS

| | | | | |
|---|---|---|---|---|
| 3,651,434 A | * | 3/1972 | McGeough | G02B 5/20 174/377 |
| 4,833,102 A | * | 5/1989 | Byrne | B23K 1/14 174/50.51 |
| 9,041,190 B2 | * | 5/2015 | Takagi | H01L 23/49582 257/700 |

* cited by examiner

*Primary Examiner* — Jasmine Clark

(74) *Attorney, Agent, or Firm* — Withrow & Terranova, P.L.L.C.

(57) ABSTRACT

The present disclosure relates to a hermetic package with improved RF stability and performance. The package includes a carrier, a bottom dielectric ring over the carrier, a bottom metal layer over the bottom dielectric ring, a top dielectric ring over the bottom metal layer, a top metal layer over the top dielectric ring, an exterior plated layer, and multiple top vias. Herein, the bottom metal layer includes signal sections and at least one ground section, which is electrically isolated from the signal sections. The exterior plated layer covers at least a portion of a first exterior sidewall of the bottom ring structure and electrically couples the carrier to the at least one ground section. The multiple top vias extend through the top dielectric ring and electrically couple the top metal layer to the at least one ground section.

26 Claims, 8 Drawing Sheets

(SECTION VIEW A-A')

(SECTION VIEW B-B')

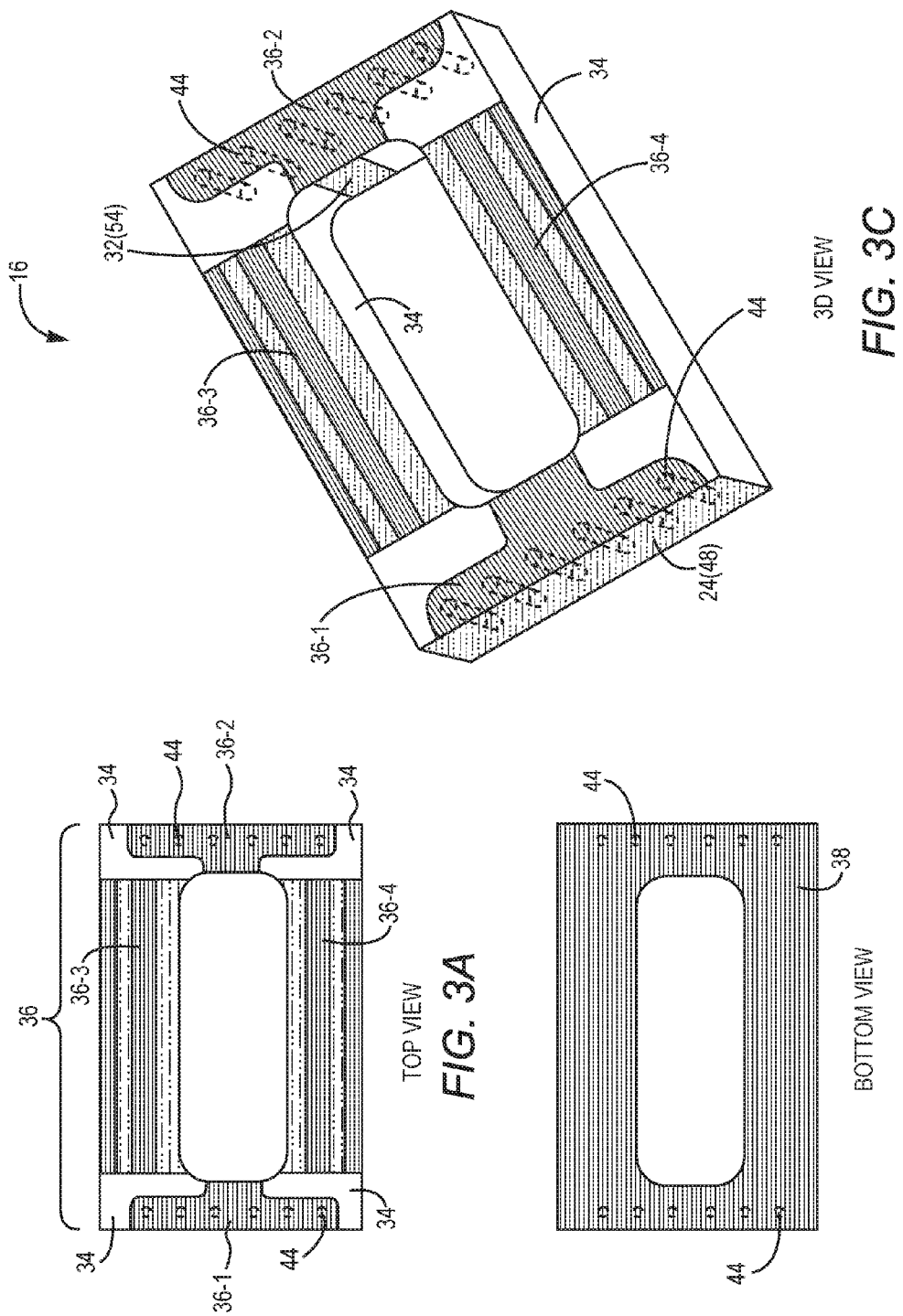

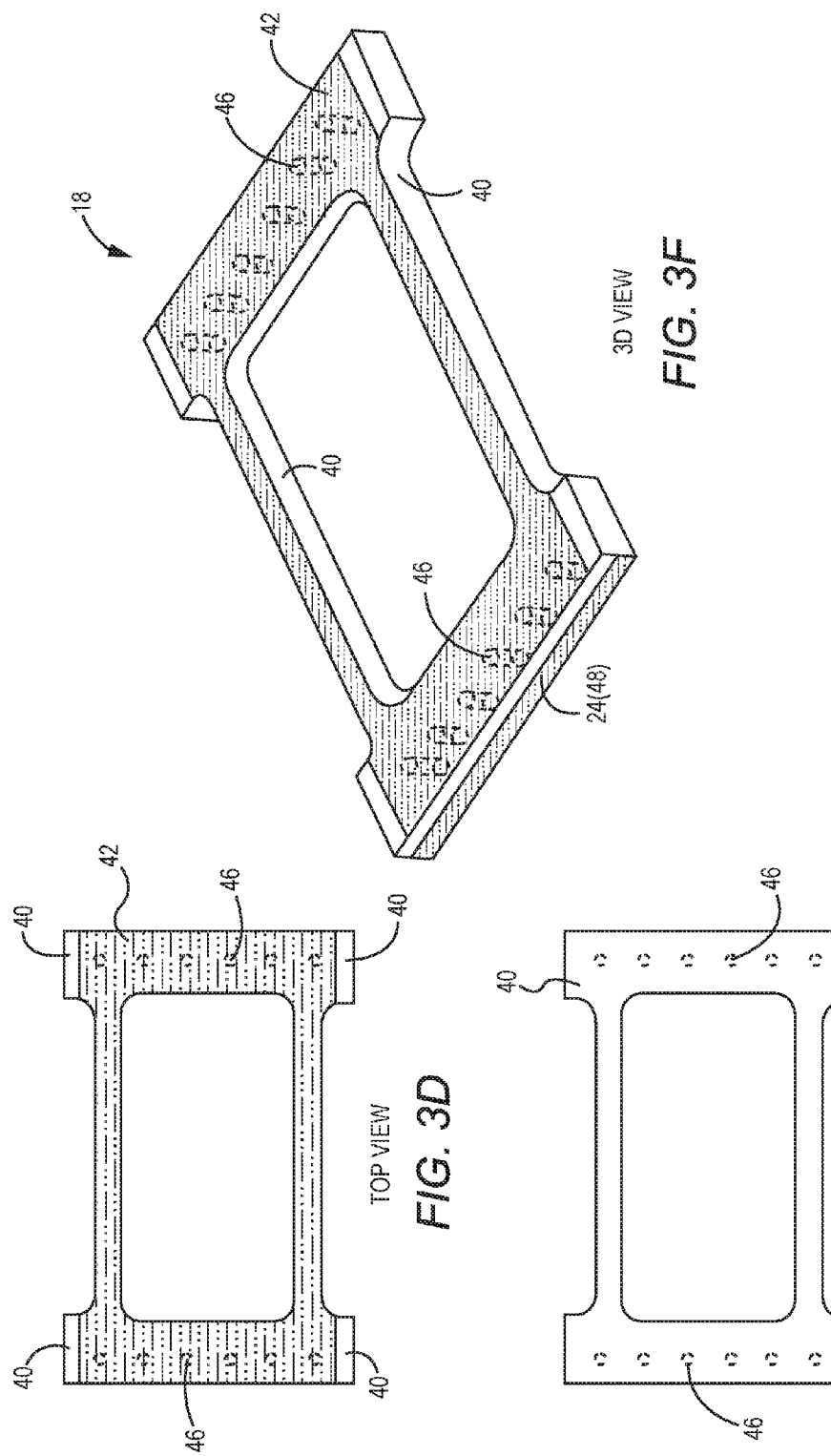

*(SECTION VIEW A-A')*

*(SECTION VIEW B-B')*

HERMETIC PACKAGE WITH IMPROVED RF STABILITY AND PERFORMANCE

RELATED APPLICATIONS

Figures 1A, 1B:
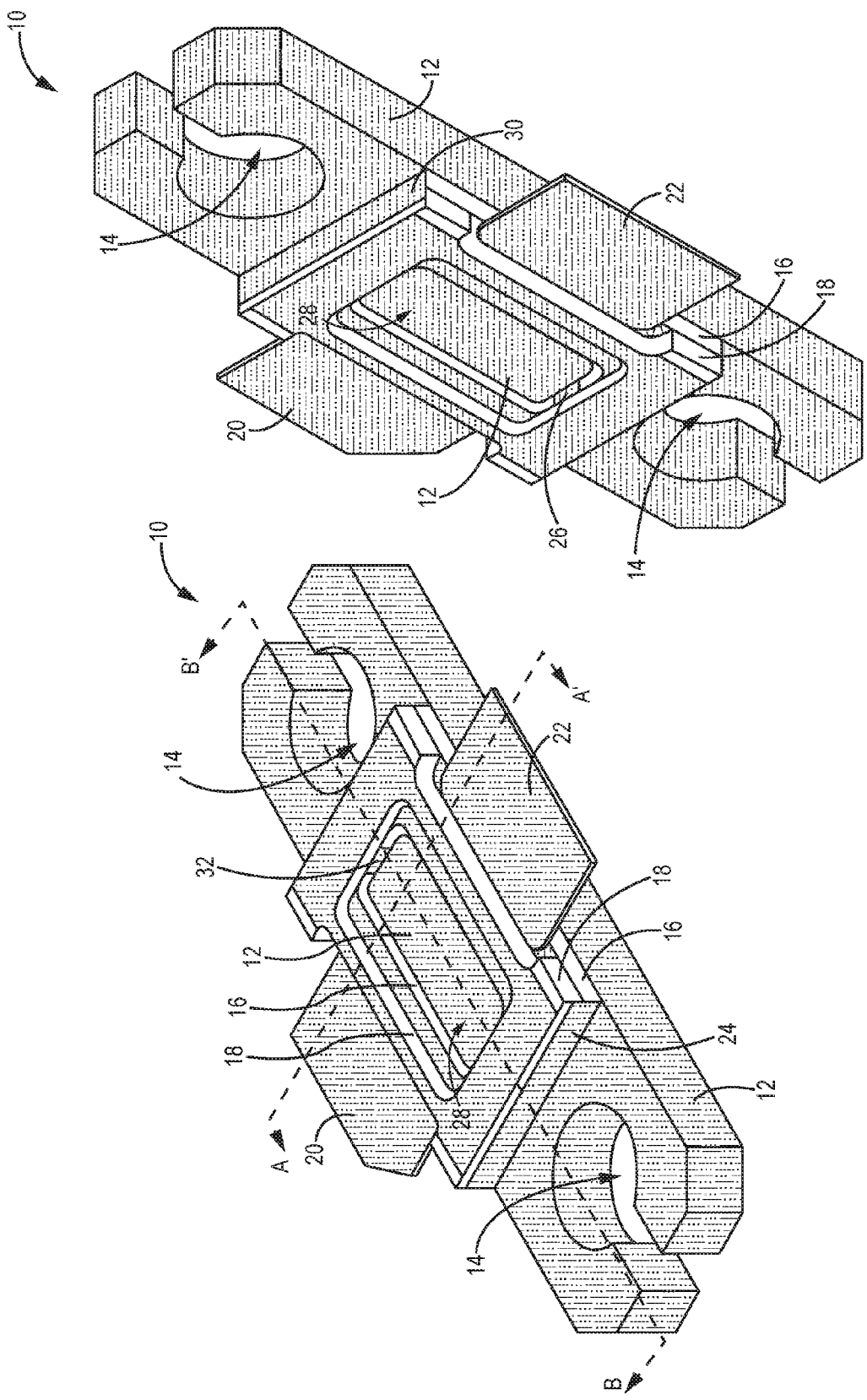

This application claims the benefit of provisional patent application Ser. No. 62/312,898, filed Mar. 24, 2016, the disclosure of which is hereby incorporated herein by reference in its entirety.

FIELD OF THE DISCLOSURE

The present disclosure relates to a hermetic package and more particularly to a hermetic package with improved radio frequency (RF) stability and performance.

BACKGROUND

Hermetic packages formed from ceramics are commonly used for semiconductor applications requiring high performance and high reliability. Hermetic sealing prevents gases and moisture from entering cavities within the hermetic packages where semiconductor dies are mounted. In addition, ceramic materials used in the hermetic packages withstand higher temperatures than a traditional plastic package and provide low Coefficient of Thermal Expansion (CTE) for the semiconductor die.

Typically, a conventional hermetic package has an ungrounded floating metallic ring on the top of a substrate. This metallic ring is needed for the eutectic Gold/Tin (Au/Sn) solder hermetic seal. However, the ungrounded floating feature of the metallic ring may lead to unwanted radio frequency (RF) coupling between input and output of the hermetic package, lead to instability of the semiconductor die, and render the package useless beyond a certain frequency of operation.

Accordingly, there remains a need for improved hermetic package designs that suppress the unwanted RF coupling and increase the stability of the semiconductor die. In addition, there is also a need to keep the final product cost and size effective.

SUMMARY

The present disclosure relates to a hermetic package with improved radio frequency (RF) stability and performance. An exemplary hermetic package includes a carrier with a top surface, a bottom ring structure, a top ring structure, a first exterior plated layer, and at least one electronic component. The bottom ring structure includes a bottom dielectric ring over the top surface of the carrier and a first bottom metal layer over the bottom dielectric ring. Herein, the first bottom metal layer includes an input section, an output section, and at least one ground section. The at least one ground section is electrically isolated from the input section and the output section. The top ring structure includes a top dielectric ring over the first bottom metal layer, a top metal layer over the top dielectric ring, and a number of top vias that extend through the top dielectric ring and electrically couple the top metal layer to the at least one ground section. In addition, the first exterior plated layer covers at least a portion of a first exterior sidewall of the bottom ring structure and electrically couples the carrier to the at least one ground section. Further, the at least one electronic component, which is mounted on the top surface of the carrier and surrounded by the bottom ring structure, is electrically coupled to the input section and the output section.

In one embodiment of the hermetic package, the first exterior plated layer is formed from a first exterior metal layer plated with a conductive material. Herein, the conductive material is Nickle/Gold (Ni/Au) or Nickel/Palladium/Gold (Ni/Pd/Au).

In another embodiment, the hermetic package further includes a first conductive tab mounted to a portion of the input section that is outside of the top ring structure, and a second conductive tab mounted to a portion of the output section that is outside of the top ring structure. Each surface of the carrier, each surface of the first conductive tab, and each surface of the second conductive tab are plated with the conductive material. Portions of the first bottom metal layer, which are exposed through the top ring structure, the first conductive tab, and the second conductive tab, are plated with the conductive material. And the top metal layer is plated with the conductive material.

In another embodiment, the hermetic package further includes a first interior plated layer covering at least a portion of a first interior sidewall of the bottom dielectric ring and electrically coupling the carrier to the at least one ground section. Herein, the first interior plated layer is formed from a first interior metal layer plated with the conductive material.

In one embodiment of the hermetic package, the bottom ring structure further includes a number of bottom vias that extends through the bottom dielectric ring and electrically couples the carrier to the at least one ground section.

In another embodiment, an alternative hermetic package includes a carrier with a top surface, a bottom ring structure, a top ring structure, a first exterior plated layer, a solder dam, and at least one electronic component. The bottom ring structure includes a bottom dielectric ring over the top surface of the carrier and a first bottom metal layer over the bottom dielectric ring. Herein, the first bottom metal layer includes an input section, an output section, and at least one ground section. The at least one ground section is electrically isolated from the input section and the output section. The top ring structure includes a top dielectric ring over the first bottom metal layer and a top metal layer over the top dielectric ring. In addition, the first exterior plated layer covers at least a portion of a first exterior sidewall of the bottom ring structure and at least a portion of a first exterior sidewall of the top ring structure, such that the carrier, the at least one ground section, and the top metal layer are electrically coupled to each other by the first exterior plated layer. The solder dam is formed on top of the top ring structure and adjacent to the first exterior plated layer. Further, the at least one electronic component, which is mounted on the top surface of the carrier and surrounded by the bottom ring structure, is electrically coupled to the input section and the output section.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 1A and 1B provide an exemplary package precursor used for a hermetic package according to one embodiment of the present disclosure.

Figure 2A:
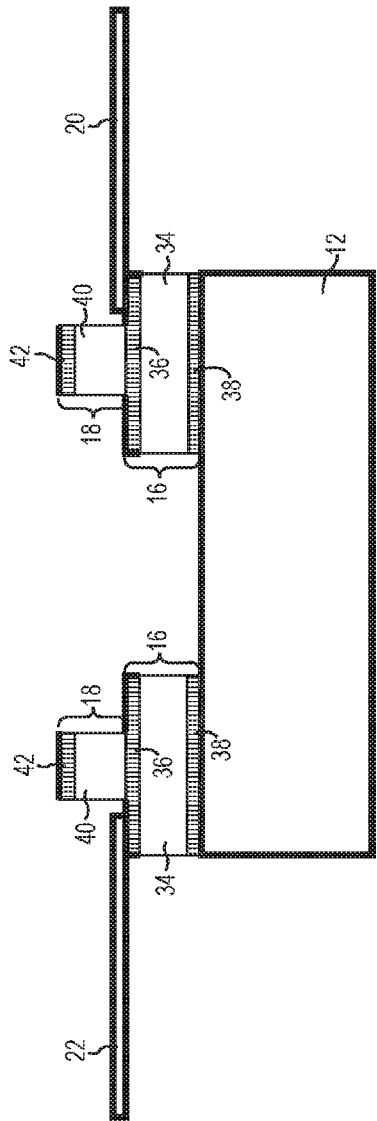
Figure 2B:
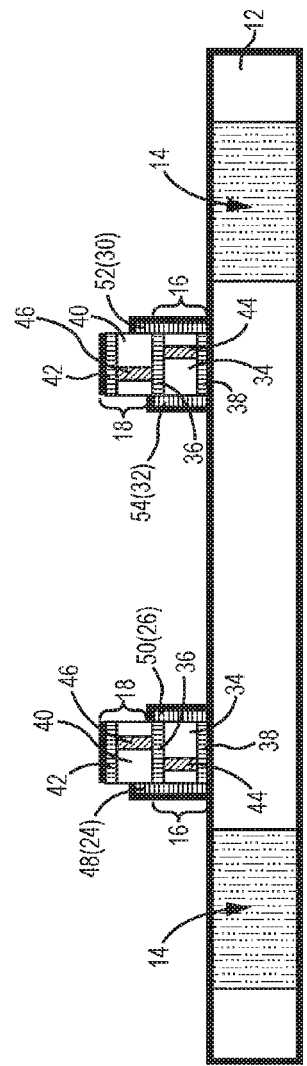

FIGS. 2A and 2B provide section views of the exemplary package precursor shown in FIG. 1A.

FIGS. 3A-3F provide details of a bottom ring structure and a top ring structure of the package precursor shown in FIG. 1A.

Figure 4:
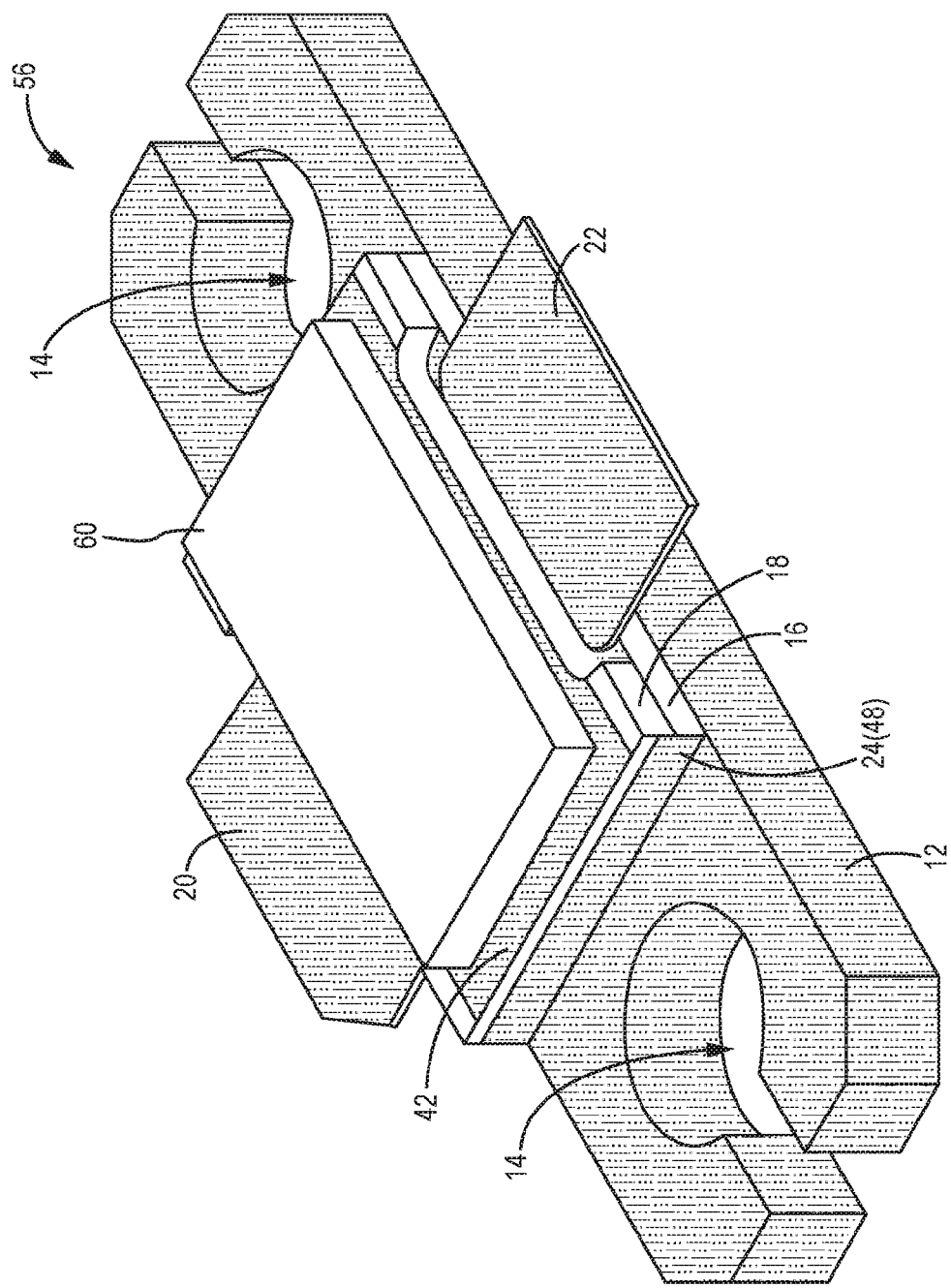

FIG. 4 shows an exemplary hermetic package formed from the package precursor shown in FIG. 1A, according to one embodiment of the present disclosure.

Figure 5A:
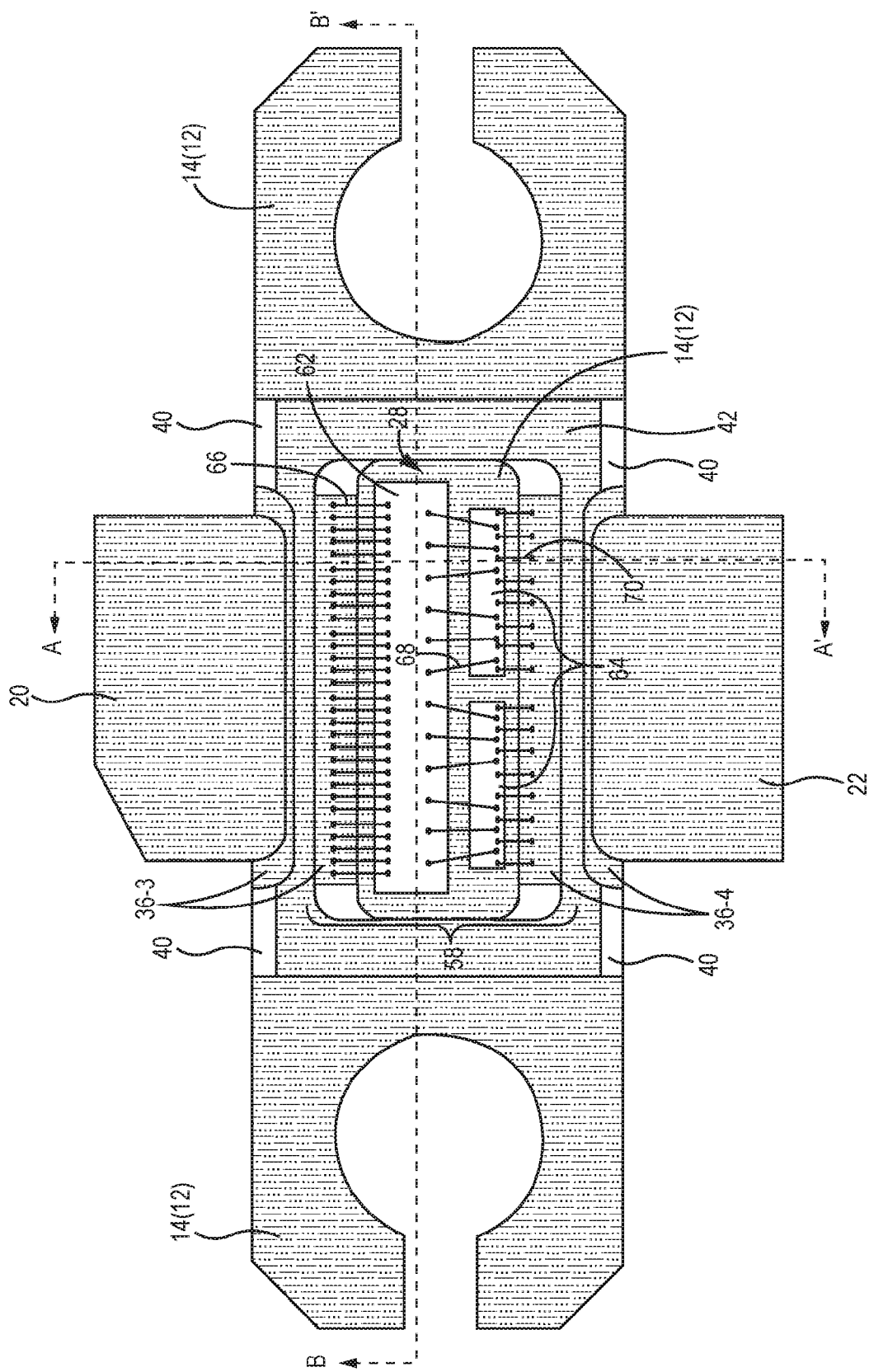
Figure 5B:
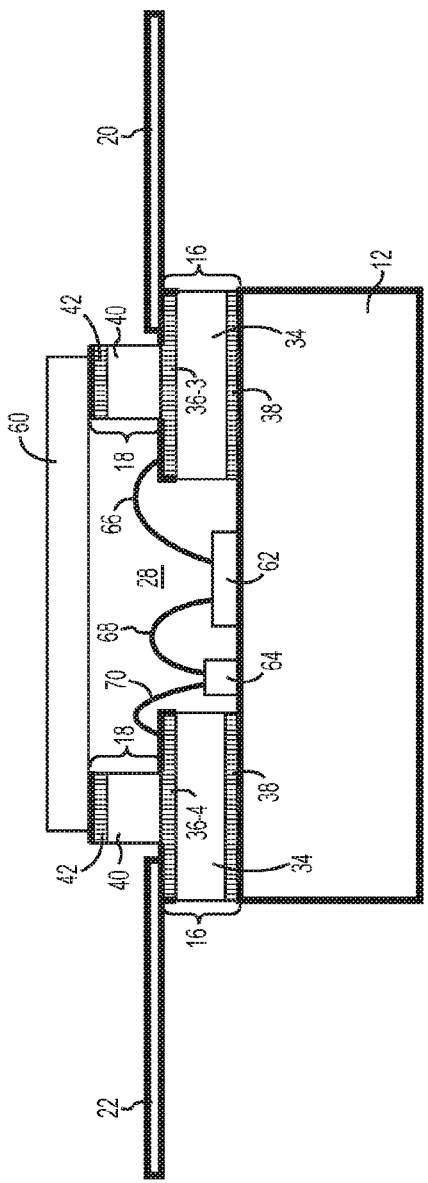
Figure 5C:
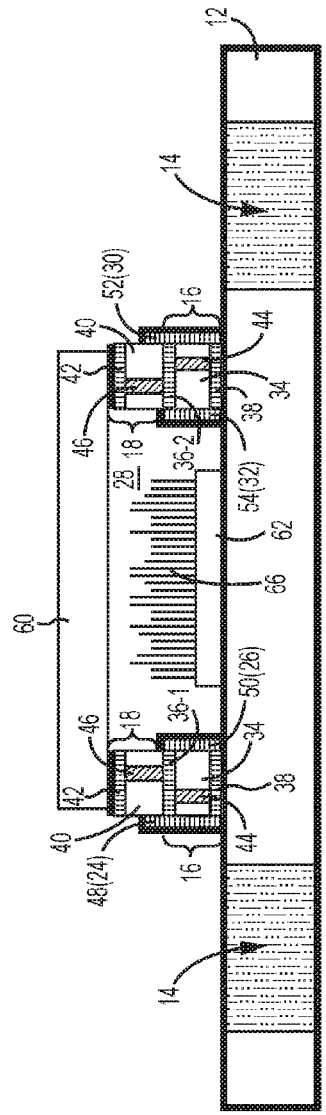

FIGS. 5A-5C provide details of at least one electronic element mounted within the hermetic package shown in FIG. 4.

Figure 6:
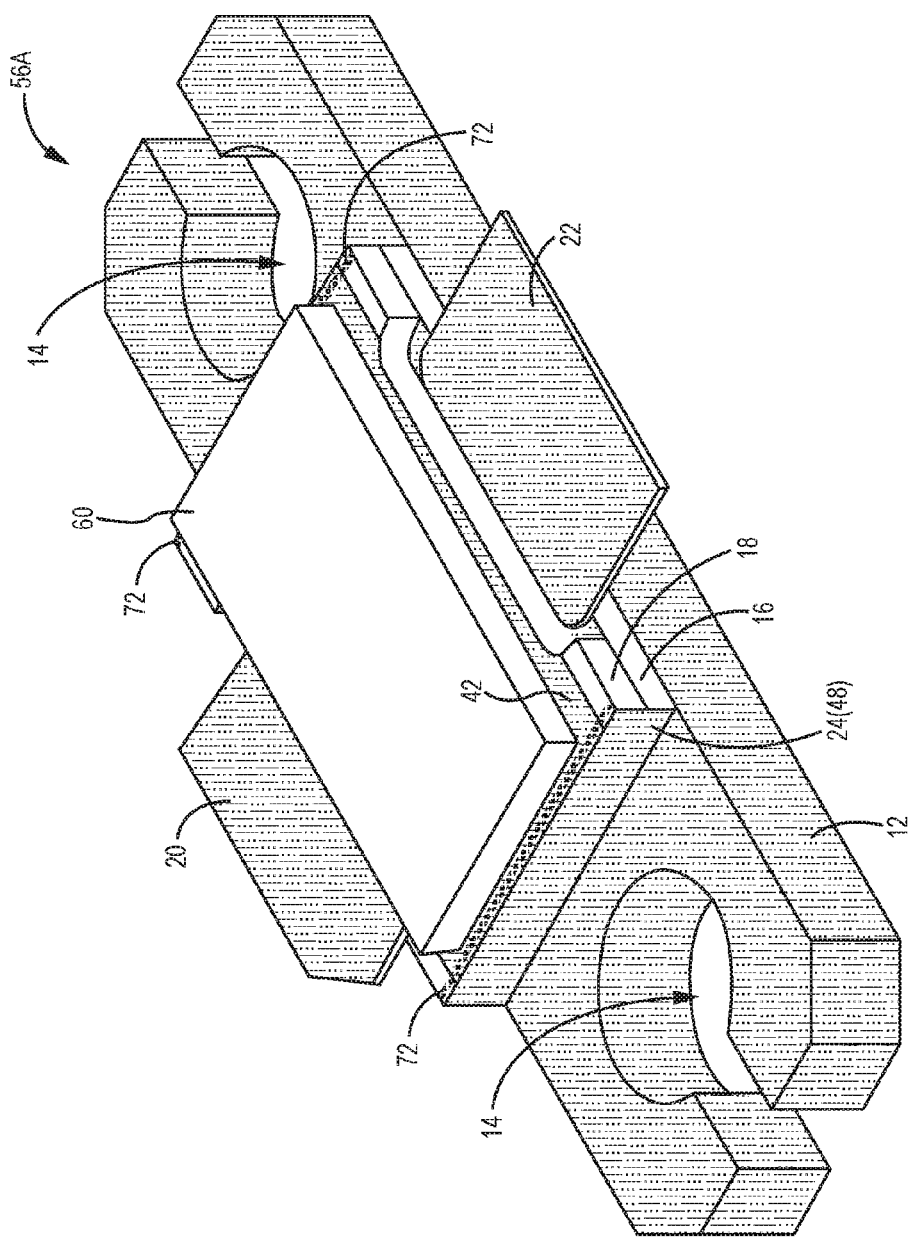

FIG. 6 shows an alternative hermetic package formed from the package precursor shown in FIG. 1A, according to one embodiment of the present disclosure.

It will be understood that for clear illustrations, FIGS. 1A-6 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a hermetic package with improved radio frequency (RF) stability and performance. FIGS. 1A and 1B show an exemplary package precursor 10 used for a hermetic package according to one embodiment of the present disclosure. FIGS. 1A and 1B show the same package precursor 10 from different perspectives. The package precursor 10 includes a carrier 12 with two mounting holes 14, a bottom ring structure 16, a top ring structure 18, a first conductive tab 20, a second conductive tab 22, a first exterior plated layer 24, and a first interior plated layer 26.

In detail, the bottom ring structure 16 is formed over a top surface of the carrier 12, and the top ring structure 18 is formed over the bottom ring structure 16. The mounting holes 14, which are used for package attachment, are outside of the bottom ring structure 16 and the top ring structure 18. In some applications, the carrier 12 may not include the mounting holes 14. A cavity 28 is defined within the bottom ring structure 16 and the top ring structure 18, and the top surface of the carrier 12 is exposed at the bottom of the cavity 28. The first conductive tab 20 and the second conductive tab 22 are mounted to opposite portions of a top surface of the bottom ring structure 16, which are outside of the top ring structure 18. The first exterior plated layer 24 covers at least a portion of a first exterior sidewall of the bottom ring structure 16 and may extend above the bottom ring structure 16, and covers a portion of a first exterior sidewall of the top ring structure 18. In some applications, the first exterior plated layer 24 may cover a majority of the first exterior sidewall of the bottom ring structure 16. Herein, the majority of the first exterior sidewall of the bottom ring structure 16 refers to at least 90% of the first exterior sidewall of the bottom ring structure 16. The first interior plated layer 26 covers at least a portion of a first interior sidewall of the bottom ring structure 16. For manufacturing requirements, the first interior sidewall of the bottom ring structure 16 may have a castellation/recess (not shown) to form the first interior plated layer 26.

In different applications, there may also be a second exterior plated layer 30 and a second interior plated layer 32. The second exterior plated layer 30 covers at least a portion of a second exterior sidewall of the bottom ring structure 16, and may extend above the bottom ring structure 16, and covers a portion of a second exterior sidewall of the top ring structure 18. The second interior plated layer 32 covers at least a portion of a second interior sidewall of the bottom ring structure 16, where the second interior sidewall of the bottom ring structure 16 may have a castellation/recess (not shown).

FIGS. 2A-2B show section views of the package precursor 10. As illustrated in FIG. 2A, the bottom ring structure 16 includes a bottom dielectric ring 34, a first bottom metal layer 36, and a second bottom metal layer 38. The first bottom metal layer 36 is formed at a top surface of the bottom dielectric ring 34, and the second bottom metal layer 38 is formed at a bottom surface of the bottom dielectric ring 34 and in contact with the top surface of the carrier 12. The top ring structure 18 includes a top dielectric ring 40 and a top metal layer 42. The top dielectric ring 40 is in contact with the first bottom metal layer 36 and the top metal layer 42 is formed over a top surface of the top dielectric ring 40.

Herein, the carrier 12, the first conductive tab 20, and the second conductive tab 22 may be formed from solid metal, such as copper plate. The bottom dielectric ring 34 and the top dielectric ring 40 may be formed from ceramic or plastic. The first bottom metal layer 36, the second bottom metal layer 38, and the top metal layer 42 may be formed from tungsten paste or the like. In addition, each surface of the carrier 12, each surface of the first conductive tab 20, and each surface of the second conductive tab 22 are fully plated with a conductive material (shown as bold lines). The top metal layer 42 is fully plated by the conductive material (shown as bold lines). Portions of the first bottom metal layer 36, which are exposed through the top ring structure 18, the first conductive tab 20, and the second conductive tab 22, are plated by the conductive material (shown as bold lines). The second bottom metal layer 38 is essentially not plated. The conductive material used for plating may be formed of Nickle/Gold (Ni/Au) or Nickel/Palladium/Gold (Ni/Pd/Au).

As illustrated in FIG. 2B, the bottom ring structure 16 may also include a number of bottom vias 44, which extend through the bottom dielectric ring 34 and electrically couple the first bottom metal layer 36 and the carrier 12 through the second bottom metal layer 38. The top ring structure 18 may also include a number of top vias 46, which extend through the top dielectric ring 40 and electrically couple the top metal layer 42 and the first bottom metal layer 36 on the bottom dielectric ring 34. Further, the first exterior plated layer 24 is formed from a first exterior metal layer 48 fully plated with the conductive material (shown as bold lines), the first interior plated layer 26 is formed from a first interior metal layer 50 fully plated with the conductive material (shown as bold lines), the second exterior plated layer 30 is formed from a second exterior metal layer 52 fully plated with the conductive material (shown as bold lines), and the second interior plated layer 32 is formed from a second interior metal layer 54 fully plated with the conductive material (shown as bold lines). Herein, the first exterior metal layer 48, the first interior metal layer 50, the second exterior metal layer 52, and the second interior metal layer 54 may be formed from tungsten paste or the like. The conductive material used for plating may be formed of Nickle/Gold (Ni/Au) or Nickel/Palladium/Gold (Ni/Pd/Au).

FIGS. 3A-3C provide details of the bottom ring structure 16 shown in FIG. 1A. For the purpose of this illustration, the first bottom metal layer 36 includes a first ground section 36-1, a second ground section 36-2, an input section 36-3, and an output section 36-4. In different applications, the first bottom metal layer 36 may have fewer or more ground sections. The first ground section 36-1 and the second ground section 36-2, which are covered by the top ring structure 18 (not shown), are essentially not plated. Portions of the input section 36-3, which are exposed through the top ring structure 18 (not shown) and the first conductive tab 20 (not shown), are plated with the conductive material. Portions of the input section 36-3, which are covered by the top ring structure 18 (not shown) and the first conductive tab 20 (not shown) are not plated. Similarly, portions of the output section 36-4 which are exposed through the top ring structure 18 (not shown) and the second conductive tab 22 (not shown), are plated with the conductive material. Portions of the output section 36-4, which are covered by the top ring structure 18 (not shown) and the second conductive tab 22 (not shown) are not plated. The first ground section 36-1 and the second ground section 36-2 are electrically isolated from the input section 36-3 and the output section 36-4. For clear illustrations, only two bottom vias 44 are labeled with reference numbers. A first set of the bottom vias 44 extends through the bottom dielectric ring 34 and electrically couples the first ground section 36-1 and the second bottom metal layer 38; and a second set of the bottom vias 44 extends through the bottom dielectric ring 34 and electrically couples the second ground section 36-2 and the second bottom metal layer 38.

FIGS. 3D-3F provide details of the top ring structure 18 shown in FIG. 1A. It is clear that the top metal layer 42 covers at least 70% of the top dielectric ring 40, and the top metal layer 42 is fully plated. For clear illustrations, only two top vias 46 are labeled with reference numbers. A first set of the top vias 46 extends through the top dielectric ring 40 and electrically couples the top metal layer 42 and the first ground section 36-1 on the bottom dielectric ring 34. A second set of top vias 46 extends through the top dielectric ring 40 and electrically couples the top metal layer 42 and the second ground section 36-2 on the bottom dielectric ring 34.

In combining FIGS. 1A-3F, it is clear that the first conductive tab 20 is mounted to a portion of the input section 36-3 that is outside of the top ring structure 18; and the second conductive tab 22 is mounted to a portion of the output section 36-4 that is outside of the top ring structure 18. The top metal layer 42 is electrically coupled to the carrier 12 by the top vias 46, the first bottom metal layer 36, the bottom vias 44, and the second bottom metal layer 38. Since the carrier 12 may be utilized as a ground plane, the top metal layer 42 is no longer floating. From an RF perspective, the highest possible number of the top vias 46 and the bottom vias 44 is desired to ground the top metal layer 42 with a low-inductance. However, a large number of vias poses manufacturing difficulties. Further, the large number of vias may result in porous top and bottom dielectric rings, which may lead to non-hermeticity and weak structures. Accordingly, the present disclosure restricts the number of vias to a maximum allowed per fabrication rules.

In order to increase grounding paths from the top metal layer 42 to the carrier 12, the first exterior plated layer 24, the first interior plated layer 26, the second exterior plated layer 30, and the second interior plated layer 32 are utilized. Herein, the first exterior plated layer 24 and the first interior plated layer 26 are adjacent to the first set of the bottom vias 44, and the second exterior plated layer 30 and the second interior plated layer 32 are adjacent to the second set of bottom vias 44. The first exterior plated layer 24 covers at least a portion of the first exterior sidewall of the bottom ring structure 16, and electrically couples the first ground section 36-1 and the carrier 12. The first interior plated layer 26 covers at least a portion of the first interior sidewall of the bottom ring structure 16 and electrically couples the first ground section 36-1 and the carrier 12. The second exterior plated layer 30 covers at least a portion of the second exterior sidewall of the bottom ring structure 16 and electrically couples the second ground section 36-2 and the carrier 12. The second interior plated layer 32 covers at least a portion of the second interior sidewall of the bottom ring structure 16 and electrically couples the second ground section 36-2 and the carrier 12.

In this embodiment, none of the first exterior plated layer 24, the first interior plated layer 26, the second exterior plated layer 30, and the second interior plated layer 32 are in contact with the top metal layer 42. These plated layers may extend just above the bottom ring structure 16, such that the first exterior plated layer 24, the first interior plated layer 26 are in contact with the first ground section 36-1, and the second exterior plated layer 30 and the second interior plated layer 32 are in contact with the second ground section 36-2.

FIG. 4 shows an exemplary hermetic package 56 formed from the package precursor 10 shown in FIG. 1A, according to one embodiment of the present disclosure. Besides the package precursor 10, the hermetic package 56 further includes at least one electronic component 58 within the cavity 28 (not shown) and a lid 60 over the top ring structure 18, which is used to seal the cavity 28 and encapsulate the at least one electronic component 58. Because none of the first exterior plated layer 24, the first interior plated layer 26, the second exterior plated layer 30, and the second interior plated layer 32 contact the top metal layer 42, solder materials (not shown) used to attach the lid 60 to the top ring structure 18 will not flow down the sides of the top ring structure 18 or the bottom ring structure 16.

FIGS. 5A-5C provide details of the at least one electronic element 58 included in the hermetic package 56 according to one embodiment of the present disclosure. FIG. 5A illustrates a top view of the at least one electronic element 58 within the cavity 28 (the lid 60 is not shown for clear illustrations). FIGS. 5B-5C show section views of the at least one electronic element 58 within the cavity 28 (with lid 60).

For the purpose of this illustration, the at least one electronic element 58 includes a die 62, two capacitors 64, a number of first bonding wires 66, a number of second bonding wires 68, and a number of third bonding wires 70 (only one first bonding wire 66, one second bonding wire 68, and one third bonding wire 70 are labeled with reference numbers for clarity). In different applications, the at least one electronic element 58 may include various combinations of virtually any type of electronic components.

As illustrated in FIGS. 5B-5C, the die 62 and the capacitors 64 are mounted on the top surface of the carrier 12 and surrounded by the bottom ring structure 16 and the top ring structure 18. The die 62 is coupled to the input section 36-3 via the first bonding wires 66, the die 62 is coupled to the capacitors 64 via the second bonding wires 68, and the capacitors 64 are coupled to the output section 36-4 via the third bonding wires 70. Consequently, the die 62 is also electrically coupled to the output section 36-4 through the capacitors 64.

FIG. 6 shows an alternative hermetic package 56A according to one embodiment of the present disclosure. Compared with the hermetic package 56, the alternative hermetic package 56A further includes solder dams 72 on top of the top ring structure 18. One of the solder dams 72 is adjacent to the first exterior plated layer 24, and another solder dam 72 is adjacent to the second exterior plated layer 30 (not shown). In this embodiment, the first exterior plated layer 24 may further extend upward across the first exterior sidewall of the top ring structure 18 and connect the top metal layer 42. The second exterior plated layer 30 may further extend upward across the second exterior sidewall of the top ring structure 18 (not shown) and contact the top metal layer 42. As such, the carrier 12, the first ground section 36-1, and the top metal layer 42 are electrically coupled to each other by the first exterior plated layer 24. The carrier 12, the second ground section 36-2, and the top metal layer 42 are electrically coupled to each other by the second exterior plated layer 30 (not shown). Accordingly, the first and second exterior plated layers 24 and 30 provide additional paths to ground the top metal layer 42. Because of the solder dams 72, the solder material (not shown) used for attachment between the lid 60 and the top ring structure 18 is prevented from flowing down the sides of the top ring structure 18 or the bottom ring structure 16. The solder dams 72 may be formed from alumina paste or the like.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a carrier with a top surface;
   a bottom ring structure, wherein the bottom ring structure comprises:
      a bottom dielectric ring over the top surface of the carrier; and
      a first bottom metal layer over the bottom dielectric ring comprising an input section, an output section, and at least one ground section, wherein the at least one ground section is electrically isolated from the input section and the output section;
   a top ring structure, wherein the top ring structure comprises:
      a top dielectric ring over the first bottom metal layer;
      a top metal layer over the top dielectric ring; and
      a plurality of top vias that extend through the top dielectric ring and electrically couple the top metal layer to the at least one ground section;
   a first exterior plated layer covering at least a portion of a first exterior sidewall of the bottom ring structure and electrically coupling the carrier to the at least one ground section; and
   at least one electronic component mounted on the top surface of the carrier and surrounded by the bottom ring structure, wherein the at least one electronic component is electrically coupled to the input section and the output section.

2. The apparatus of claim 1 wherein the first exterior plated layer is formed from a first exterior metal layer plated with a conductive material.

3. The apparatus of claim 2 wherein the conductive material is Nickle/Gold (Ni/Au) or Nickel/Palladium/Gold (Ni/Pd/Au).

4. The apparatus of claim 1 wherein the first exterior plated layer extends above the first bottom metal layer and covers a portion of a first exterior sidewall of the top dielectric ring.

5. The apparatus of claim 1 further comprising a first conductive tab mounted to a portion of the input section that is outside of the top ring structure and a second conductive tab mounted to a portion of the output section that is outside of the top ring structure.

6. The apparatus of claim 5 wherein:
the first exterior plated layer is formed from a first exterior metal layer plated with a conductive material;
each surface of the carrier, each surface of the first conductive tab, and each surface of the second conductive tab are plated with the conductive material;
portions of the first bottom metal layer, which are exposed through the top ring structure, the first conductive tab, and the second conductive tab, are plated with the conductive material; and
the top metal layer is plated with the conductive material.

7. The apparatus of claim 1 further comprising a first interior plated layer covering at least a portion of a first interior sidewall of the bottom dielectric ring and electrically coupling the carrier to the at least one ground section.

8. The apparatus of claim 7 wherein:
the first exterior plated layer is formed from a first exterior metal layer plated with a conductive material; and
the first interior plated layer is formed from a first interior metal layer plated with the conductive material.

9. The apparatus of claim 1 wherein the bottom ring structure further comprises a plurality of bottom vias that extends through the bottom dielectric ring and electrically couples the carrier to the at least one ground section.

10. The apparatus of claim 9 wherein the first exterior plated layer is formed from a first exterior metal layer plated with a conductive material.

11. The apparatus of claim 9 further comprising a first interior plated layer covering at least a portion of a first interior sidewall of the bottom dielectric ring and electrically coupling the carrier to the at least one ground section.

12. The apparatus of claim 11 wherein:
the first exterior plated layer is formed from a first exterior metal layer plated with a conductive material; and
the first interior plated layer is formed from a first interior metal layer plated with the conductive material.

13. The apparatus of claim 1 further comprising a second exterior plated layer, wherein:
the at least one ground section comprises a first ground section and a second ground section;
the first exterior plated layer electrically couples the carrier to the first ground section; and
the second exterior plated layer covers at least a portion of a second exterior sidewall of the bottom ring structure and electrically couples the carrier to the second ground section.

14. The apparatus of claim 13 wherein:
the first exterior plated layer is formed from a first exterior metal layer plated with a conductive material; and
the second exterior plated layer is formed from a second exterior metal layer plated with the conductive material.

15. The apparatus of claim 13 further comprising a first interior plated layer and a second interior plated layer, wherein:
the first interior plated layer covers at least a portion of a first interior sidewall of the bottom dielectric ring and electrically couples the carrier to the first ground section; and
the second interior plated layer covers at least a portion of a second interior sidewall of the bottom dielectric ring and electrically couples the carrier to the second ground section.

16. The apparatus of claim 15 wherein:
the first exterior plated layer is formed from a first exterior metal layer plated with a conductive material;
the second exterior plated layer is formed from a second exterior metal layer plated with the conductive material;
the first interior plated layer is formed from a first interior metal layer plated with the conductive material; and
the second interior plated layer is formed from a second interior metal layer plated with the conductive material.

17. The apparatus of claim 1 wherein the first exterior plated layer covers at least 90% of the first exterior sidewall of the bottom ring structure.

18. The apparatus of claim 1 wherein the bottom ring structure further comprises a second bottom metal layer, which is formed at a bottom surface of the bottom dielectric ring and in contact with the top surface of the carrier.

19. The apparatus of claim 1 further comprising a lid over the top ring structure to encapsulate the at least one electronic component.

20. The apparatus of claim 1 wherein the carrier is a ground plane.

21. The apparatus of claim 1 further including a solder dam on top of the top ring structure and adjacent to the first exterior plated layer.

22. An apparatus comprising:
a carrier with a top surface;
a bottom ring structure, wherein the bottom ring structure comprises:
a bottom dielectric ring over the top surface of the carrier; and
a first bottom metal layer over the bottom dielectric ring comprising an input section, an output section, and at least one ground section, wherein the at least one ground section is electrically isolated from the input section and the output section;
a top ring structure, wherein the top ring structure comprises:
a top dielectric ring over the first bottom metal layer; and
a top metal layer over the top dielectric ring;
a first exterior plated layer covering at least a portion of a first exterior sidewall of the bottom ring structure and at least a portion of a first exterior sidewall of the top ring structure, such that the carrier, the at least one ground section, and the top metal layer are electrically coupled to each other by the first exterior plated layer;
a solder dam formed on top of the top ring structure and adjacent to the first exterior plated layer; and
at least one electronic component mounted on the top surface of the carrier and surrounded by the bottom ring structure, wherein the at least one electronic component is electrically coupled to the input section and the output section.

23. The apparatus of claim 22 wherein the first exterior plated layer is formed from a first exterior metal layer plated with a conductive material.

24. The apparatus of claim 22 further comprising a first interior plated layer covering at least a portion of a first interior sidewall of the bottom dielectric ring and electrically coupling the carrier to the at least one ground section.

25. The apparatus of claim 24 wherein:
the first exterior plated layer is formed from a first exterior metal layer plated with a conductive material; and
the first interior plated layer is formed from a first interior metal layer plated with the conductive material.

26. The apparatus of claim 25 wherein:
the bottom ring structure further comprises a plurality of bottom vias that extend through the bottom dielectric ring and electrically couple the carrier to the at least one ground section; and
the top ring structure further comprises a plurality of top vias that extends through the top dielectric ring and electrically couples the top metal layer to the at least one ground section.

* * * * *